United States Patent
Chen

(10) Patent No.: US 7,455,788 B2
(45) Date of Patent: Nov. 25, 2008

(54) NANOSCALE ELECTRIC LITHOGRAPHY

(75) Inventor: Yong Chen, Sherman Oaks, CA (US)

(73) Assignee: The Regents of the University of California, Oakland, CA (US)

( * ) Notice: Subject to any disclaimer, the term of this patent is extended or adjusted under 35 U.S.C. 154(b) by 128 days.

(21) Appl. No.: 11/480,256

(22) Filed: Jun. 29, 2006

(65) Prior Publication Data

US 2007/0034599 A1    Feb. 15, 2007

Related U.S. Application Data

(63) Continuation of application No. PCT/US2005/000901, filed on Jan. 12, 2005.

(60) Provisional application No. 60/536,115, filed on Jan. 12, 2004.

(51) Int. Cl.
*H01L 21/302* (2006.01)

(52) U.S. Cl. ............................ 216/41; 216/216; 216/54

(58) Field of Classification Search .................... 216/41
See application file for complete search history.

(56) References Cited

U.S. PATENT DOCUMENTS

| | | | |
|---|---|---|---|
| 5,798,146 A | | 8/1998 | Murokh et al. |
| 5,960,319 A | * | 9/1999 | Iwata et al. ................. 438/664 |
| 6,153,498 A | * | 11/2000 | Hsu ........................... 438/526 |
| 6,262,426 B1 | | 7/2001 | Zafiratos |
| 2006/0208313 A1 | * | 9/2006 | Atanackovic ............... 257/327 |

* cited by examiner

*Primary Examiner*—Keith D. Hendricks
*Assistant Examiner*—Patricia A George
(74) *Attorney, Agent, or Firm*—John P. O'Banion

(57) ABSTRACT

A nanoscale lithographic method in which a reusable conductive mask, having a pattern of conductive surfaces and insulating surfaces, is positioned upon a substrate whose surface contains an electrically responsive resist layer over a buried conductive layer. When an electric field is applied between the conductive mask and buried conductive layer, the resist layer is altered in portions adjacent the conductive areas of the mask. Selective processing is performed on the surface of the substrate, after mask removal, to remove portions of the resist layer according to the pattern transferred from the mask. The substrate may be a target substrate, or the substrate may be utilized for a lithographic masking step of another substrate. In one aspect of the invention the electrodes to which the charge is applied are divided, such as into a plurality of rows and columns wherein any desired pattern may be created without the need to fabricate specific masks.

19 Claims, 7 Drawing Sheets

NANOSCALE ELECTRIC LITHOGRAPHY

CROSS-REFERENCE TO RELATED APPLICATIONS

This application claims priority from, and is a 35 U.S.C. §111(a) continuation of, co-pending PCT international application serial number PCT/US2005/000901, filed on Jan. 12, 2005, incorporated herein by reference in its entirety, which designates the U.S., which claims priority from U.S. provisional application Ser. No. 60/536,115 filed on Jan. 12, 2004, incorporated herein by reference in its entirety.

This application is related to PCT International Publication Number WO 2005/070167 A2, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to nanoscale fabrication methods, and more particularly to a method of fabricating nanoscale patterns on an electrically configurable layer of a substrate using an electric field mask.

2. Description of Related Art

The progress of lithography in the past three decades has continued to reduce minimum feature size of leading-edge semiconductor devices about 70% with each new generation that is brought forth approximately every two to three years. However, current lithographic techniques face very significant challenges as feature sizes are reduced to nanoscale dimensions. New lithographic solutions have been explored from a number of vantage points, including exposure tools, masks, resists and all the associated processing steps. For example, imprinting lithography has been employed to fabricate nanoscale devices and circuits with high-rates and the capability for being scaled-up to production levels.

However, the industry has not been able to solve the yield and defect problems that arise from the interaction between the mold and the polymer resist during the imprinting lithographic processes. While the use of sequential (non-parallel) beam directed, or pen-based lithographic techniques can not be scaled-up toward mass fabrication.

Accordingly, a need exists for a new nanoscale manufacturing method which provides reliability and practicality while maintaining high-speed and scalability. The present invention fulfills those needs and others while overcoming drawbacks with previous processes.

BRIEF SUMMARY OF THE INVENTION

A new nanoscale manufacturing method (technique) is described which comprises a nanoscale electric lithography (NEL) process for fabricating nanoscale patterns on electrically configurable resists by using an electric mask. The NEL method combines the merits of high-speed and scalable top-down engineering techniques with high-resolution bottom-up self-assembly processes to create a practical, reliable, and robust nano-manufacturing technique for general application.

The present invention can take full advantage of the concept that electrically configurable resist can be designed to have a chemical or physical affinity for a particular substrate surface. Specifically, when the resist is brought into contact with an appropriate substrate surface, the thermodynamically favored arrangement can be optimized to produce a densely packed resist layer, such as a monolayer of molecules. There exist a variety of electrically configurable resists that may be utilized.

By way of example, the resists which may be utilized can be self-assembling molecular layers, polymers, monomers, oligomers and inorganic materials whose characteristics are changed in response to the application of a sufficient electric field. In one embodiment the resist layer can comprise a self-assembled layer of molecules with end group/substrate combinations including by way of example and not limitation thiol/gold (Au), silane/silicide (i.e., $SiO_2$), carbonyl/titanium (Ti), and amine/platinum (Pt). A film created as a self-assembled monolayer (SAM) is particularly well-suited for electron beam lithography (EBL) and techniques based on either the atomic force microscope (AFM) or the scanning tunneling microscope (STM) referred to as AFM/STM techniques, which can obtain a resolution of one nanometer (1 nm). However, these procedures are not suitable solutions for mass production due to their slow speeds, and sequential nature.

In addition the resist layer for NEL can be formed with polymers, monomers, oligomers and so forth which have electrically configurable properties. During the NEL process, the monomers and oligomers can be cross-linked or the links in polymers can be broken by the electric field applied from the patterns of the mask. In the electrically configured areas, the solubility of the resist layer in solvent will be changed during the post-exposure development process, and therefore the patterns can be transferred to the resist. The monomers and oligomers can be cross-linked by electrochemical techniques, including by way of example and not limitation pyrrole. The dopant concentrations in polymers can also be changed when an electric field is applied, the change of the dopant concentrations can also induce the change of the solubility of the polymers in the solvent.

The resist can also comprise a number of inorganic materials. The patterns can be generated by phase changes induced by electric fields generated by patterns on the mask during NEL process. The phase changes can be amorphous state-crystal state-phase change, electrical dipole moment change, magnetic momentum change, liquid-crystal phase change, phase separation, and chemical composition change.

It should be appreciated that the characteristics of the resist material is responsive to a sufficient electric field exposure, such as exposure which is sufficient to change molecular links, bonds, phases, or any combination thereof in the resist layer. Preferred embodiments of the NEL invention can therefore utilize a material for the resist which is selected from the group of resist materials consisting essentially of self-assembled molecules, polymers, monomers, oligomers and inorganic materials whose characteristics change in response to sufficient exposure to an electric field.

Dip-pen nanolithography (DPN) has the potential to enhance the rate of AFM-based lithography by utilizing parallel arrays of probes. However, the speed and resolution of this technique is limited by (1) the diameter of the tip, (2) the width of the meniscus, (3) the minimum scale (i.e., 1 μm) of each probe base, and (4) physical limitations on the number of probes which can be practically supported and maintained. EBL and AFM probes have been used to generate nanoscale patterns on self-assembled molecular monolayers using electrochemical reactions. The present invention provides a technique that overcomes a number of drawbacks of these techniques including scalability issues.

The NEL techniques described herein provide a new nano-manufacturing concept which provides a number of benefits. The technique can be utilized for lithography at ultra-high resolutions, such as defined by the electrode features sizes on the masks, which can exhibit single-molecule resolution on the order of 1 nm or below. NEL is a parallel lithography process which can facilitate high-speed, low-cost, scaled-up (mass production) capabilities. NEL can provide a reliable and low-defect process, at least in part due to the resist, non-reactive mask, and the discrete nature of electrochemical reactions. A specific embodiment of the method utilizes a regrowth layer on the sidewall of the trenches to fabricate masks at or below 1 nm. A dynamic mask embodiment is described that can be used to generate arbitrary patterns controlled by a computer aided engineering (CAD) application thereby greatly increasing the number of patterns that can be programmed into a single mask, essentially removing the need for costly mask fabrication. In addition, by sensing the capacitance formed between the electrodes on the mask and substrate, the alignment status can be detected in-situ to improve alignment accuracy down to a fraction of the minimum pattern size.

NEL can provide a general manufacturing technology with wide-ranging applicability to nano-manufacturing and industrial production. By way of example and not limitation, NEL methods have applicability in computing, telecommunications, photonics, biotechnology, medicine, energy, and in other applications requiring fabrication of devices with very small feature sizes in the nanometer range.

The invention is amenable to being embodied in a number of ways, including but not limited to the following.

One embodiment of the invention can be described as a method of lithographic fabrication, comprising: (a) forming a conductive mask pattern; (b) forming a substrate having an electrically configurable (i.e., alterable) layer over a buried conductive layer; (c) patterning the electrically configurable layer to alter its characteristics in response to applying an electric field between conductive portions of the mask pattern and the conductive layer; and (d) processing of the substrate selectively, based on the pattern created by the patterning by the applied electric field. In a preferred embodiment the processing of the substrate comprises a process in which the portions of the electrically alterable layer which were made more soluble in response to exposure to the electric field are removed by a suitable solvent-based process.

An embodiment of the invention can be described as a method of lithographic fabrication, comprising: (a) forming a conductive mask; (b) forming a substrate having an electrically configurable resist layer (e.g., self-assembled) over a buried conductive layer; (c) positioning the conductive mask upon the resist layer of the substrate; (d) applying an electric field between the conductive mask and the conductive layer of the substrate to alter the resist; (e) separating the conductive mask from the substrate; and (f) selectively removing the resist in response to the mask pattern which was selectively exposed by the electric fields. Determining alignment during positioning is preferably provided as a combination of registration techniques including sensing capacitance changes when the mask and substrate reach sufficiently close proximity.

The resist layer may comprise a combination of self-assembled molecular layer and buried conductor layer selected from the group of resist group/substrate combinations consisting essentially of thiol/Au, silane/$SiO_2$, carbonyl/Ti, amine/Pt. It will be appreciated that other materials may be selected for the resist including polymers, monomers, oligomers, as well as inorganic materials and so forth whose characteristics, to be affected by a subsequent process, have been altered in response to exposure to the electric field. In the preferred embodiment, the resist material is preferably selected so that its solubility is changed in response to the electric field while it provides high resolution patterning that is compatible with the conductive layer.

The conductive mask comprises an electrode, an insulator on the surface of the electrode, and a plurality of conductive regions extending from, or joined to, the electrode. The conductive mask can be fabricated by: (a) creating a conductive pattern on a conductive substrate; and (b) forming an insulating layer over the conductive substrate, or a combination of the conductive substrate and conductive pattern. Typically, the insulating layer is then polished to expose the conductive pattern and flatten the surface of the substrate. This technique is applicable to mask pattern feature sizes at or less than approximately ten nanometers (10 nm). A higher resolution mask (i.e., at or even less than-one nanometer, 1 nm) can be fabricated by: (a) creating a conductive pattern on a conductive substrate; (b) depositing a multi-layer lattice having at least two different metals on the conductive pattern; (c) removing a surface portion of the multi-layer lattice; and (d) processing the surface of the multi-layer in a selective process in which the different metals are differentially altered (i.e., not equally altered). For example, processing of the surface preferably comprises an oxidation process which is selective as to which metal is oxidized.

The electric field is applied to the resist layer to structurally alter this material to either increase or decrease solubility of the "exposed" portions (exposed to the applied electric field) of the resist layer to a removal process for selectively removing exposed portions of the resist layer. Typically, the exposed portions of the resist layer are more or less readily removed by using a conventional solvent-based removal process, or the like. For example, the molecular resist layer has lateral bonds linking the molecules which are cleaved in portions exposed to the electric field to increase the solubility toward removal by solvents.

The substrate may be further processed to allow transferring the created patterns of the resist layer onto the surface materials of other substrates.

The conductive mask, or the conductive layer of the substrate, or a combination of both, may be divided into separately addressable conductive areas in which desired patterns are fabricated in response to electric field exposure in the areas between the separately addressable conductive areas. The conductive regions can be divided into separately addressable conductive rows and columns so that patterning is performed in response to applying the electric field between selected rows and columns.

In another aspect of the invention the alignment (registration) of the mask to the substrate when at close proximity is sensed in response to changes in the capacitance between the conductive mask and the electrode layer in the substrate.

An embodiment of the invention can be described as a method of lithographic fabrication, comprising: (a) forming a conductive mask; (b) forming a substrate having an electric field responsive resist layer over a buried conductive layer; (c) positioning the conductive mask upon the resist layer of the substrate; (d) applying an electric field between the conductive mask and the buried conductive layer of the substrate to change the solubility of the resist (which is exposed to the electric field) when exposed to a solvent; (e) separating the conductive mask from the substrate; and (f) selectively removing resist with a solvent in response to the mask pattern which was selectively exposed by the electric fields; and (g) transferring the pattern of the resist layer onto other materials to pattern them.

As in the other embodiments, the conductive portions to which the electric field is applied can be divided into separately addressable portions, such as rows oriented in a first direction and columns oriented in a second transverse direction, allowing any arbitration pattern to be fabricated in response to addressing the rows and columns, without the need of fabricating a new mask. The material used for the resist layer can comprise a self-assembled molecular layer, polymers, monomers, oligomers, inorganic materials and so forth whose solubility can be changed in response to exposure to the electric field.

Embodiments of the present invention provide a number of beneficial aspects which can be implemented either separately or in any desired combination. The inventive aspects include, but are not necessarily limited to, the following.

An aspect of the invention is a parallel process applicable over large areas for performing nanoscale lithography.

Another aspect of the invention is a nanoscale lithography process which utilizes an electric mask temporarily disposed on the resist layer over an embedded conductive area on a material, substrate, or the like.

Another aspect of the invention is a rapid nanoscale lithography process which can be scaled to mass production levels.

Another aspect of the invention is a nanoscale lithography process which utilizes the properties of SAM films interacting with an electric mask.

Another aspect of the invention is a nanoscale lithography process which utilizes a resist layer selected from the group of polymers, monomers, oligomers, and/or inorganic materials whose characteristics (e.g., solubility) are responsive to electric fields.

Another aspect of the invention is a nanoscale lithography process which provides more rapid and less expensive manufacturing of nanoscale items than can be achieved using scanning probes.

Another aspect of the invention is a nanoscale lithography process which utilizes a mask which can be fabricated utilizing conventional lithographic methods.

Another aspect of the invention is a nanoscale lithography process which can be utilized for creating sub-ten-nanometer patterns ($\leq 10$ nm), and preferably providing single-molecule resolutions down to at or below about one nanometer ($\leq 1$ nm).

Another aspect of the invention is a nanoscale lithography process which exhibits a low defect density.

Another aspect of the invention is a nanoscale lithography process which can be configured using a dynamic mask that allows generating any desired lithography patterns at the point of manufacture, therein removing the costs of fabricating individual masks.

A still further aspect of the invention is a nanoscale lithography process that can be widely utilized in fabricating a variety of circuits and structures for a variety of industries, including computing, telecommunications, photonics, biotechnology, medicine, energy, and other areas requiring nano geometries and production level, or near production level, output.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1A:
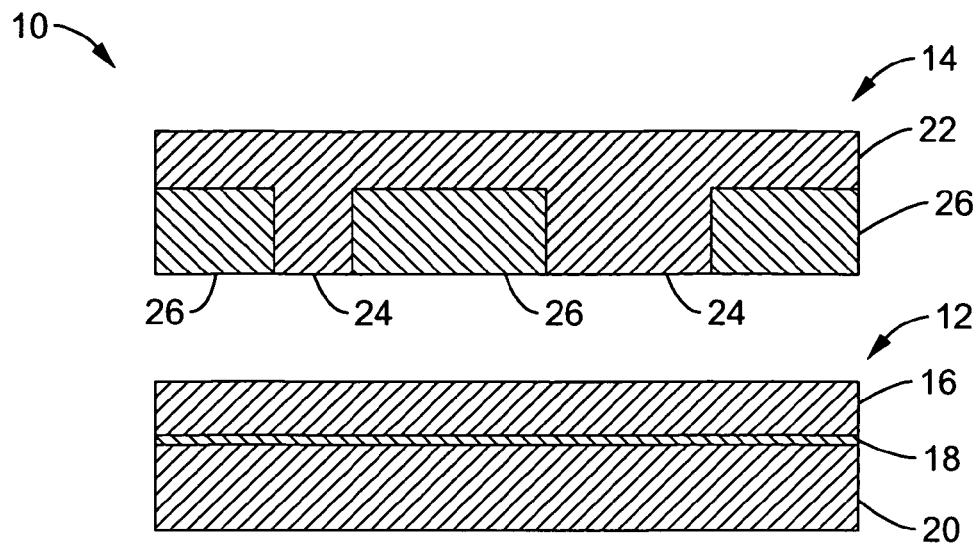
FIG. 1A-1C are cross-section views of a nanoscale electrochemical lithography (NEL) process according to an embodiment of the present invention, showing three steps during the lithography process.

Referring more specifically to the drawings, for illustrative purposes the present invention is embodied in the apparatus generally shown in FIG. 1 through FIG. 8. It will be appreciated that the method may vary as to the specific steps and sequence, without departing from the basic concepts as disclosed herein.

The present invention provides a new nano-manufacturing technique referred to herein as nanoscale electric lithography (NEL). The NEL technique patterns electrically configurable resist using an electric field generated between a mask and a buried conductive layer rather than by using scanning beams or probes. The basic NEL process is simple and straightforward and unlike scanning techniques, it provides concurrent parallel processing for a layer as a two dimensional array.

FIG. 1A-1D illustrate by way of example an embodiment 10 of the NEL technique with a layered substrate 12 and conductive mask 14. Layered substrate 12 comprises an electric field responsive resist layer 16, over an electrode layer 18 on substrate 20.

The surface of conductive mask 14 comprises a combination of conductive and insulating portions forming a lithography pattern. Conductive mask 14 is fabricated as a material having at least one conductive electrode and a plurality of conductive regions extending from, or joined to, the electrode. Mask 14 is shown having a conductive substrate element 22 configured with extended portions 24, which are preferably deposited on conductive substrate element 22. Alternatively, conductive extended portions 24 may extend from an electrode layer on an otherwise non-conductive substrate. The extended conductive portions may be created by any convenient additive or subtractive process. The extending conductive metal patterns 24 on mask 12 are separated by insulating materials 26. In one embodiment the mask is formed by adding conductive materials (i.e., platinum) to a conductive substrate, followed by creating an insulating layer and then polishing back the insulator to expose the conductive portions and to planarize the surface. The conductive patterns of electrode 22, as well as electrode 18, are configured according to the desired application. For example, although electrode 18 is depicted in this embodiment as a planar conductive layer, it may be fabricated according to any desired shape or with a plurality of conductors.

Figure 1B:
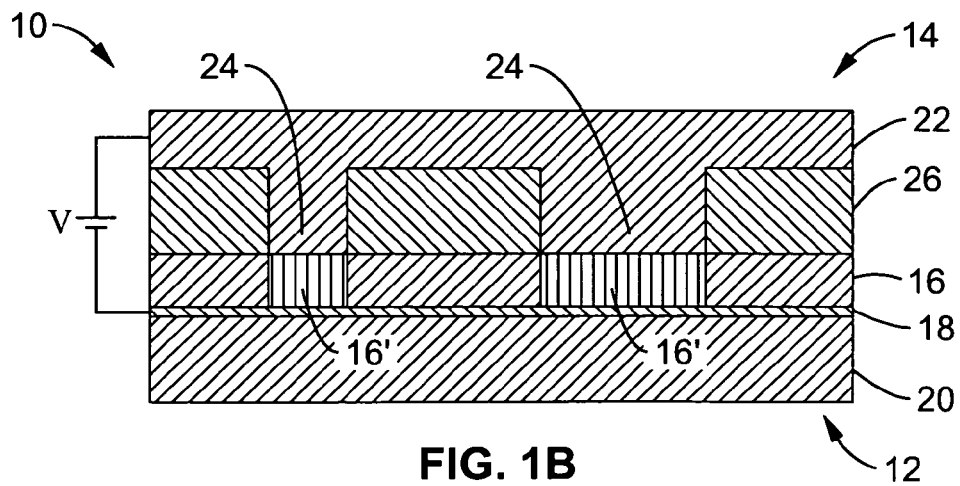

FIG. 1B illustrates mask 14 being positioned, in contact and in proper alignment, with resist layer 16 of layered substrate 12 in preparation for patterning the resist layer. Preferably the conductive mask is pressed onto the layered substrate according to a desired level of pressure. For example a small hydrostatic gas pressure (<10 psi) can be applied to bring the mask and resist into sufficient proximal contact to provide sufficient resist layer "exposure" to the applied electric field.

An electric field V is applied between buried conductor (electrode) 18 and electrode 22. The attractive electric force between the mask and substrate assures proper electrical contact between the mask and the resist layer. The applied electric field changes the solubility of portions of the resist material in a subsequent removal process. Preferably, "exposure" to the electric field significantly increases removal solubility in solvent (developer). However, it should be appreciated that by selecting other combinations of resist layer and removal process, that "exposure" can be utilized to create a decreased solubility to removal, depending on the application. Typically, exposure increases the solubility to removal as lateral bonds linking the molecules of the resist layer residing between the electrodes will be cleaved (or "exposed" in lithography nomenclature) due to an electrochemical reaction, while the molecules covering the remainder of the surface will remain unchanged. It will be seen that in response to "exposure" to the electric field portions 16' of resist layer 16 have altered solubility to removal.

It should also be appreciated, however, that the "exposure" provided by this method may be less preferably utilized for changing characteristics other than the solubility to chemical removal, such as susceptibility to other forms of removal, bonding ability, diffusion capabilities, and so forth, which may be suitable for use in select applications.

Figure 1C:
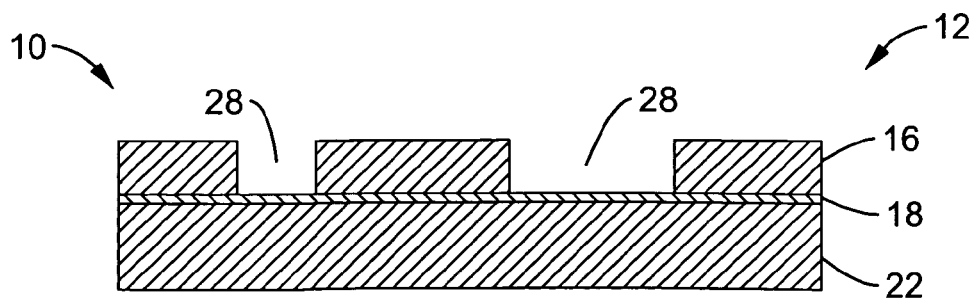

FIG. 1C depicts layered substrate 12 after mask 14 has been removed and portions of resist layer 16 which were exposed to the electric field have been selectively removed from layered substrate 12, such as by using a solvent washing process, or other removal process which is selective to the electric-field induced changes to resist layer 16. The patterned substrate 12 is shown with portions 28 of resist material layer 16 having been removed. In a less preferred embodiment different resist material layers and/or different solvents can be employed wherein the areas removed can be those which were not exposed to the electric field.

It should be appreciated that patterned substrate 12 can be further processed by chemical and/or physical methods to transfer the patterns from the resist layer onto other materials. In these patterning processes NEL retains the high-resolution benefits of scanning probe lithography, while providing for rapid manufacture in a scaled-up parallel manufacturing process.

Figure 2A:
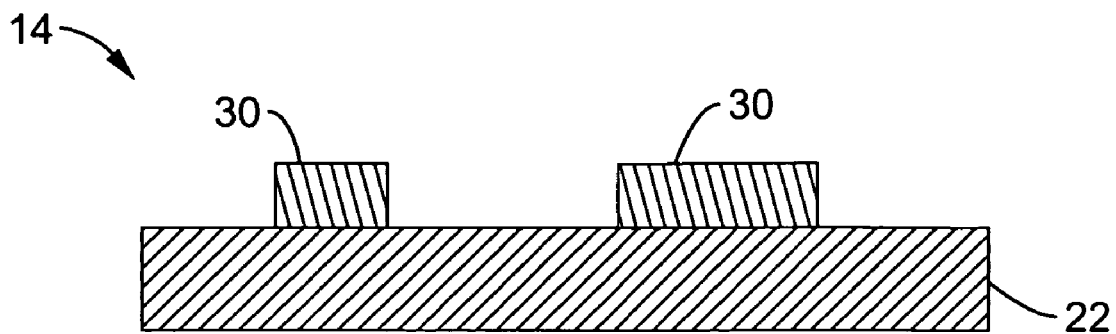
FIG. 2A-2C are cross-section views of a nanoscale electrochemical lithography (NEL) mask fabrication process according to an embodiment of the present invention.
Figure 2B:
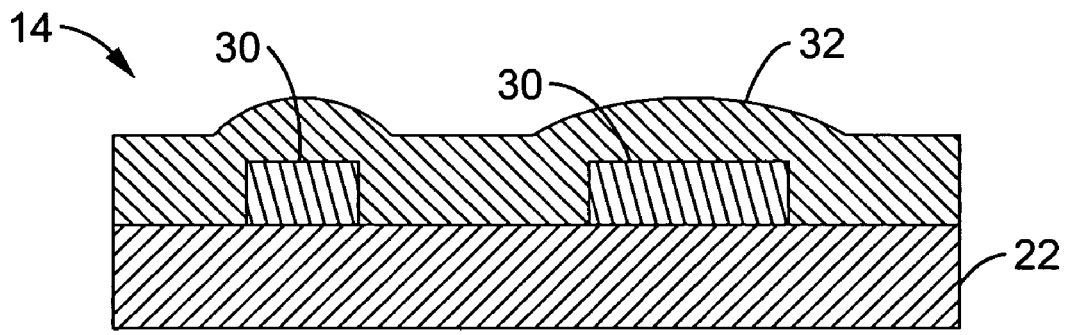
Figure 2C:
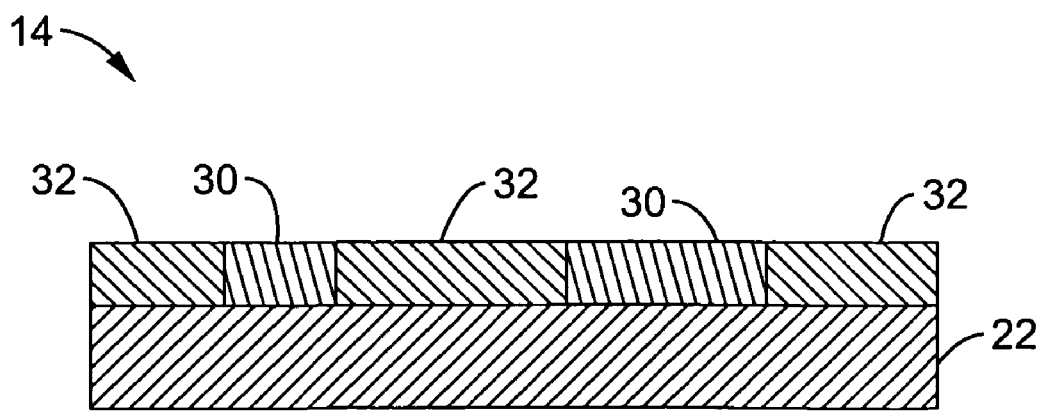

FIG. 2A-2C illustrate by way of example a fabrication process for mask 14 as shown in FIG. 1A, or similar. The previous nano-manufacturing experience of the inventor, particularly in the use of imprinting lithography, has provided an engineering foundation for the NEL process of the present invention. Nanoscale metal patterns for electrodes on a NEL mask can be defined by any desired process, for example using traditional lithographic methods such as EBL and EUV (extreme-ultraviolet) lithography.

FIG. 2A depicts a metal substrate 22 upon which a mask of metal 30 is joined. A flexible metal film can be used as the mask in order to form the electrical contact between the mask and the resist. In the embodiment of FIG. 2A mask 14 is depicted as formed from two metal layers. It should be appreciated, however, that the mask may be formed as a single metal layer, or multiple metal layers to yield the mask structure. The conductive portions of the mask may be formed from any number of additive or subtractive processes which are capable of creating conductive extensions (i.e., protrusions) from a conductive surface at sufficient nanometer resolution.

The NEL process preferably utilizes noble metals, such as platinum (Pt), as electrodes and atomically flat masks that can prevent reactions between masks and molecules during the NEL process. Consequently, NEL is not subject to the same defect problems as encountered with imprinting lithography. In a beneficial aspect of the invention, the proximal nature of the electrodes on the mask and substrate are utilized to detect in-situ the physical relationship (relative distance and/or offset) between the mask and the substrate. Preferably, the physical relationship is sensed in response to a form of capacitance measurement, wherein the measured capacitance varies in response to registration and distance factors. It should be appreciated that other characteristics of the proximal conductors in the mask and substrate could also be less preferably relied upon for detecting registration and/or distance, such as inductance, field effects, and so forth. The use of the capacitive sensing within the invention can provide alignment accuracy down to a fraction of the minimum pattern size.

To optimally implement the NEL process of the invention three key requirements for the masks should be met: (1) nanoscale conductive patterns should be capable of achieving the high resolution potential of the electrically alterable resist, (2) the mask should provide atomically flat surfaces to assure good contacts for inducing electrochemical reactions, and (3) the materials should be chosen so that no direct chemical bonding occurs between the mask materials and the resist layer thus preventing defect formation. It should be recognized that the nanoscale conductive patterns can be created using any desired process, for example advanced lithographic methods such as EUV or EBL on resists.

The nano-patterns are transferred from the resist to metal patterns using standard lift-off or dry-etching processes.

Noble metals, such as platinum, are preferred since they provide high levels of electrical conductivity while not being subject to direct reaction with the resist, therein assuring the reliability and life time of the mask. The metal substrate provides an electrical connection to the metal patterns, and when a pressure is applied, its flexibility will allow proximal contact between the mask and the resist.

FIG. 2B illustrates an insulating layer 32 covering the conductive portions 22, 30 of mask 14. The insulation may be formed by any desired process, for example by deposition such as $SiO_2$ and $Si_3N_4$ formed or deposited on the top of the metal patterns.

FIG. 2C illustrates insulation 32 of mask 14 polished back, such as utilizing chemical and/or mechanical polishing techniques. This step will flatten the mask, expose the metal patterns, and planarize the whole mask to an atomically flat surface.

The cost of fabricating these masks is expected to exceed that for one-time use masks on account of the advanced lithographic processes and related polishing processes. However, the masks should provide substantial life-times over which many copies are generated using the NEL process, therein keeping the effective operational costs of NEL masks low.

It should be appreciated that the sub-10 nm patterns on masks can also be generated by direct anodic AFM oxidation of the metal surface, but the speed is too slow to scale up to larger masks. To further reduce the pattern size on masks in order to meet the ultra-high resolution potential of the molecular resists, which is below the limits of lithographic techniques, we have invented a special technique to make masks with resolutions down to the single-molecule level (<1 nm).

Figure 3A:
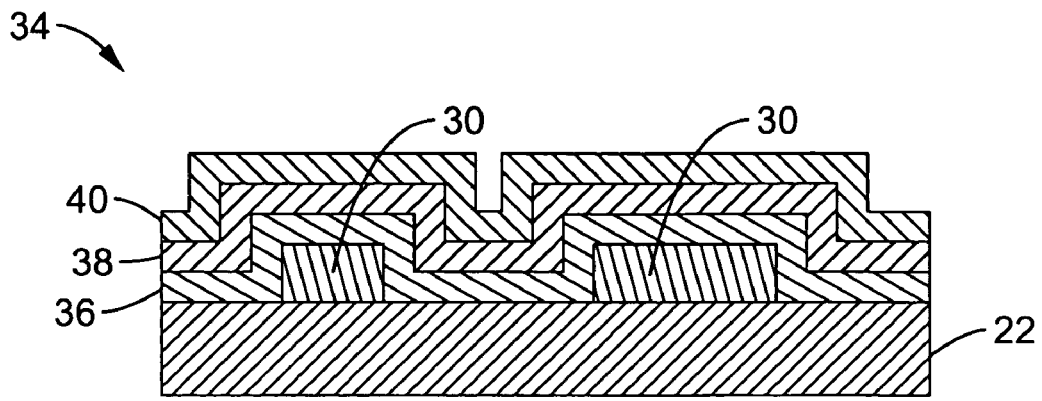
FIG. 3A-3C are cross-section views of a process for fabricating a sub-one-nanometer mask according to an embodiment of the present invention.
Figure 3B:
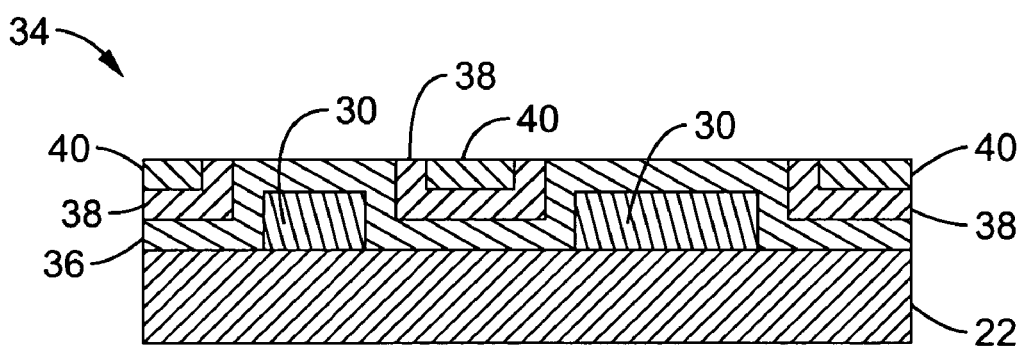
Figure 3C:
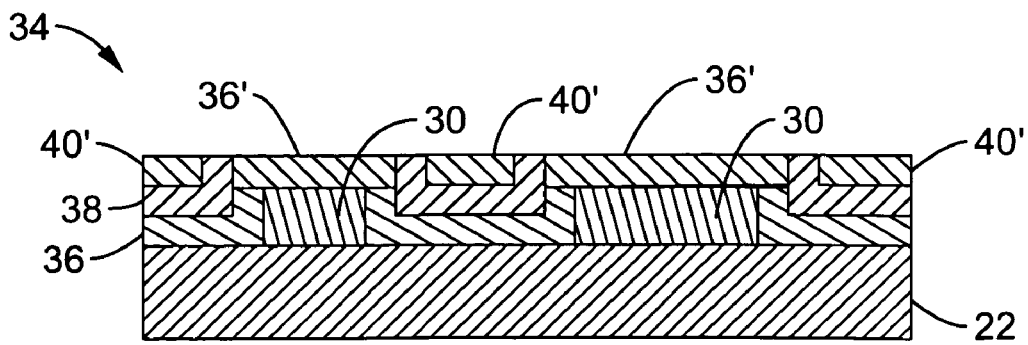

FIG. 3A-3C illustrate by way of example an embodiment 34 of a very high resolution mask creation process. FIG. 3A is shown after vertical trenches have been fabricated on a wafer and a multi-layer metal lattice of at least two different metals (i.e., aluminum (Al) and platinum (Pt)), which is referred to herein as a superlattice, is deposited on the sidewall of the trenches. The substrate 22 is shown which has a conductive surface upon which conductive electrodes 30 have been formed, and over which layers 36, 38 and 40 of metal are deposited. In the present case the layers comprise Al 36, 40 and Pt 38 within the superlattice. FIG. 3B depicts the mask after removal of a top (surface) portion, for example by polishing such as using a chemical-mechanical polishing process to remove the surface materials on the wafer.

FIG. 3C depicts the mask after the surface has been selectively processed so that the two (or more) different metals are altered in different ways or to different extents by the process. For example in the present embodiment the top remaining vertical layers of Al are oxidized from the Al/Pt superlattice to form an ultra-high resolution pattern, however, the Pt is not oxidized. The advantage of this technique is that the width and pitch of the Pt conductive lines are defined precisely by the thickness of the Pt layer, which can readily achieve feature sizes down to the single molecular level below about one nanometer (<1 nm). This method also promises a scalable way to pattern large areas employing trenches over the whole wafer.

Figure 4:
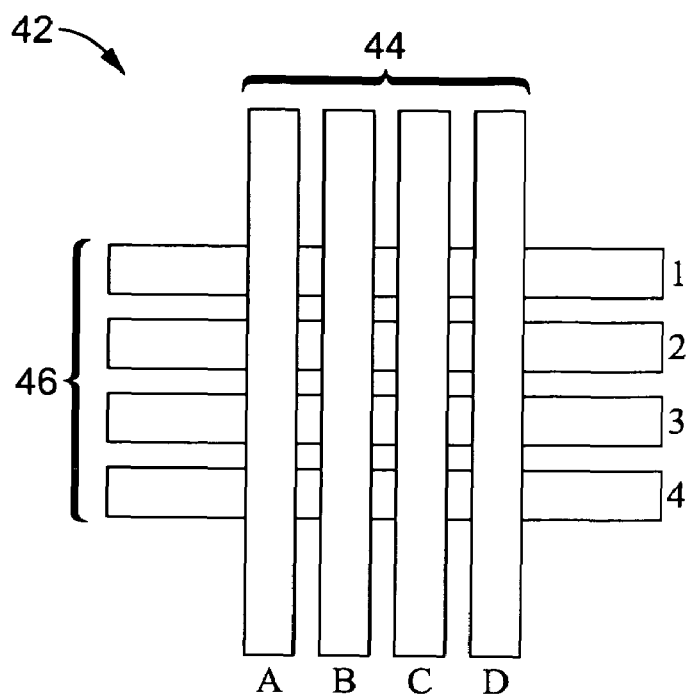
FIG. 4 is a top view of on-demand arbitrary patterns fabricated using dynamic grid masks according to an aspect of the present invention.

FIG. 4 illustrates a dynamic grid mask 42 fabricated for use with the NEL process in fabricating arbitrary patterns, without the need of creating a new mask specific to each desired pattern. It should be noted that the term "arbitrary pattern" as used herein, does not imply any form of randomness, but instead is indicative that the pattern, or at least portions of the pattern, were selected at the time of manufacture, without the need to fabricate a specific mask for that pattern. According to this process the top and/or bottom electrodes to which the electric charge is applied are divided into separately addressable portions; for example dividing the conductor layer of the substrate beneath the resist layer into a first set of separately addressable parallel conductive strips and dividing the electrode layer of the mask into a second set of separately addressable parallel conductive strips which are oriented perpendicular to the first set. In this way rows and columns are created, or any other desired regular or irregular form of division, to allow selective mask operations which suit the application. Once the mask is properly positioned on the substrate the electric field is applied between selected portions on the top and bottom electrodes to expose the desired portions of the resist layer to the electric field.

In one embodiment of this technique a first set of parallel linear electrodes 44 (strips) form the top electrodes on a mask, with a second set of parallel linear electrodes 46 (strips) oriented in a transverse direction (perpendicular to the first set of electrodes), such as forming the bottom electrodes on a substrate wherein a NEL resist is sandwiched between the top and bottom electrodes. These top and bottom electrodes, as shown in FIG. 4 form a row and column matrix between which the resist layer is disposed for being subjected to an electric field. If a voltage is applied selectively between two perpendicular electrodes (for instance between electrode A and 2), the resist at their cross-points (A,2) will be exposed to the electric field. It should be appreciated that numerous variations of this selective masking can be created, using different sizes and shapes of divisions, numbers of divisions, and variations in the positioning of conductive layers without departing from the teachings of the present invention.

Figure 5:
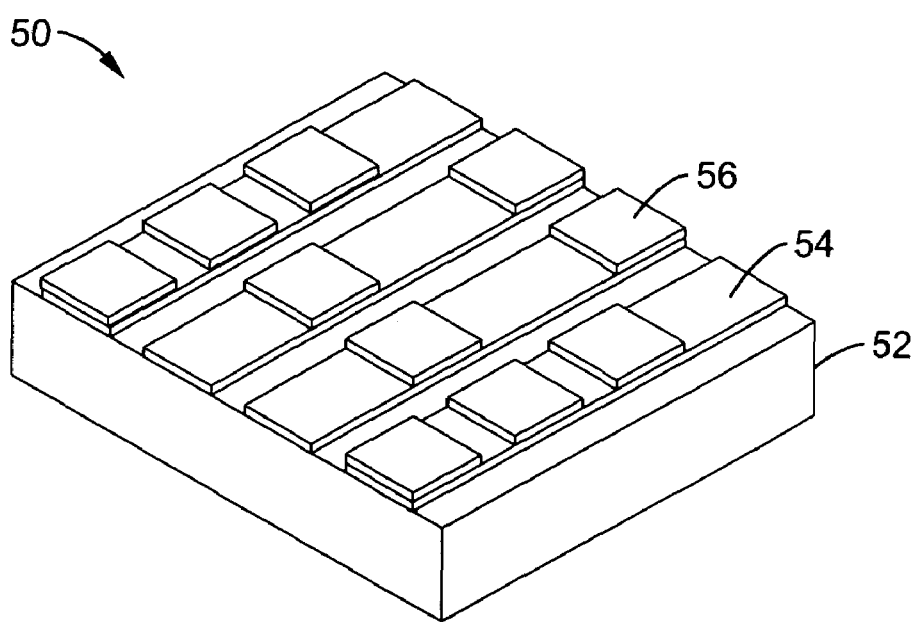
FIG. 5 is a perspective view of a surface patterned with an arbitrary pattern (selected at the time of manufacture) that can be created using nanoscale electrochemical lithography (NEL) according to an aspect of the present invention.

FIG. 5 depicts a device fabricated using the embodiment of dynamic mask shown in FIG. 4. It can be seen from this example that regular portions of the surface are selectively processed in response to the applied electric fields. By way of example and not limitation, the voltages can be applied to the electrodes utilizing a multiplexer circuit which receives signals from a computer-aided design (CAD) application program configured for creating on-demand arbitrary mask patterns.

According to this technique parallel nanowire patterns are fabricated directly on the substrate by the NEL dynamic mask, instead of using continuous thin metal films on the substrate. The nanowires on both the mask and the substrate can be connected directly with external switches in order to apply voltages selectively on each nanowire to generate patterns on the resist. Other circuits can also be utilized for controlling the application of electric signals to conductors between which the resist layer is disposed (i.e., multiplex circuits).

It should be appreciated that the above process is being optimized toward improving fabrication speed and the size of the exposed area by increasing the number of nanowires which are important factors in scaling up nano-processing techniques for use in a mass fabrication environment. As the number of nanowires increases to a large number ($>10^3$), direct electric connection with each nanowire is less practical wherein various multiplexer circuits can be utilized in order to establish limited electrical connections to address many nanowires simultaneously. It should be appreciated that the electric fields need not be simultaneously applied to the molecular layers, wherein a sequential approach utilizing multiplexers is operable.

In using the dynamic mask for creating an arbitrary substrate pattern in a continuous form, it is preferably that the machine be capable of shifting the mask, such as at a resolution of half the pitch distance, or less with respect to the area that is first exposed so as to allow making another exposure. The alignment, including sub-pitch movements can be sensed in response to the changes in capacitance between the mask and the substrate sections positioned adjacent one another. It should also be appreciated that characteristics other than capacitance may also be relied upon to assure the desired registration, such as sensing inductive changes, field effect changes, and so forth without departing from the teachings of the present invention.

Figure 6:
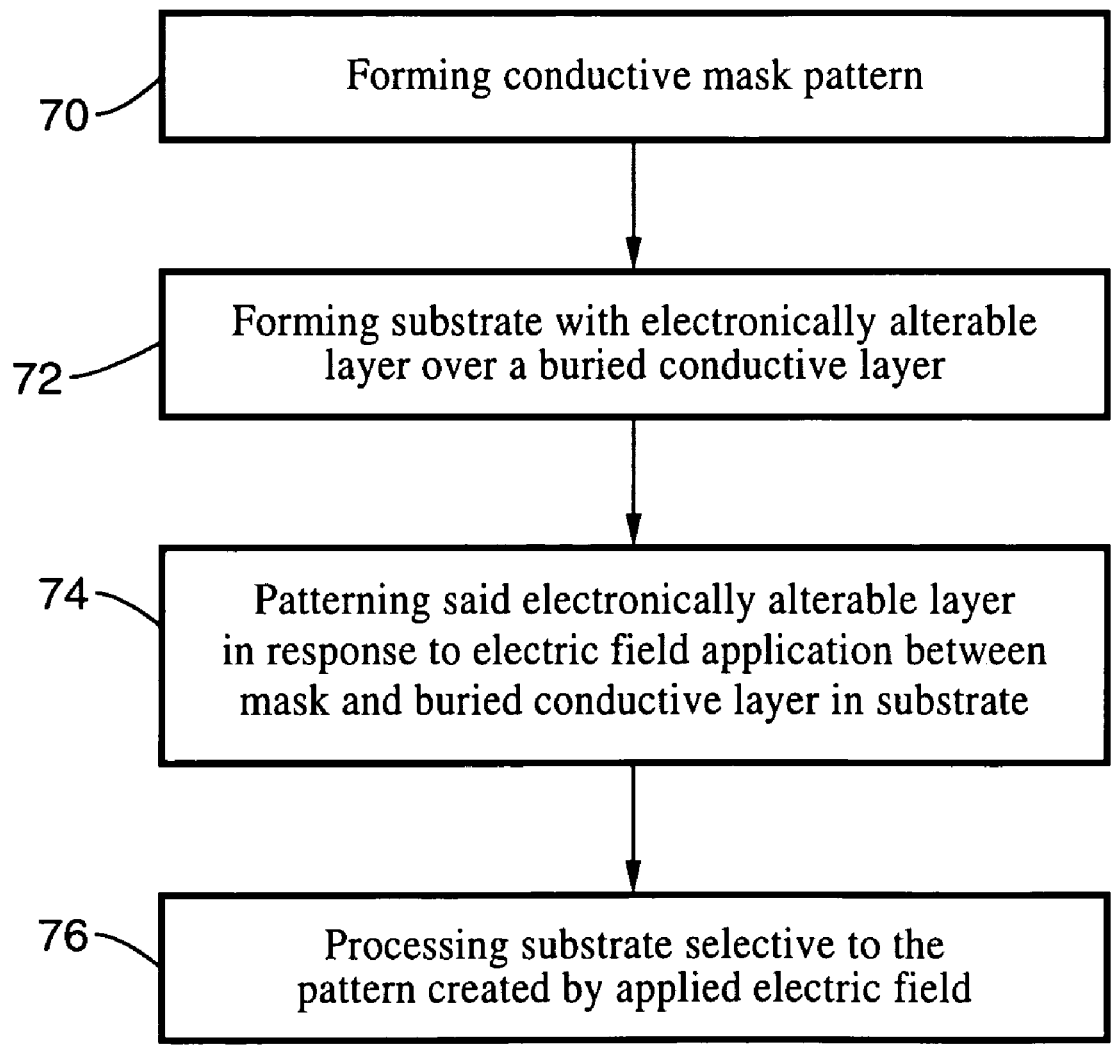
FIG. 6 is a flowchart of a method for performing nanoscale electric lithography according to an embodiment of the present invention.
Figure 7:
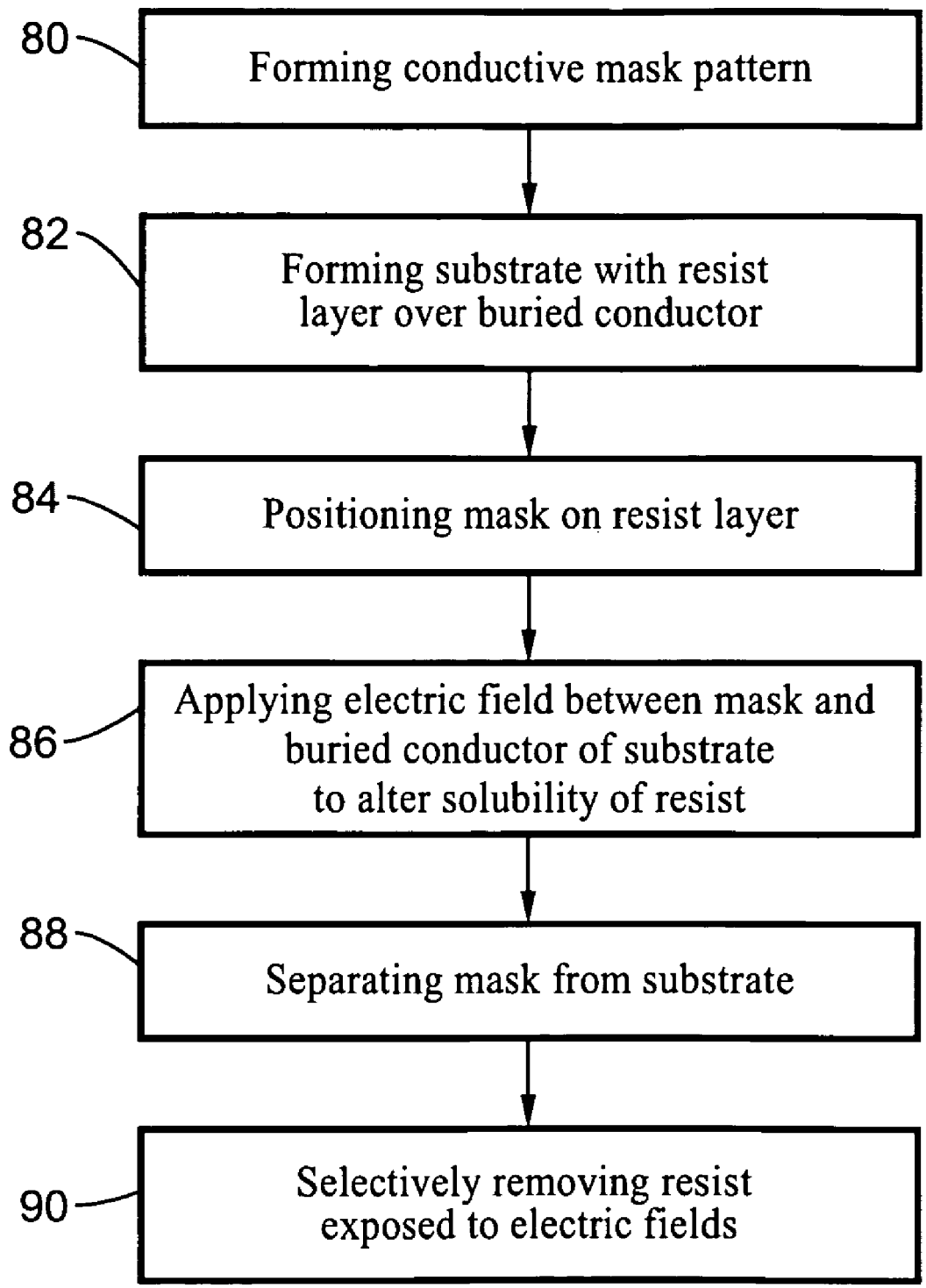
FIG. 7 is a flowchart of a method for performing nanoscale electric lithography according to an embodiment of the present invention which describes detailed aspects of patterning.
Figure 8:
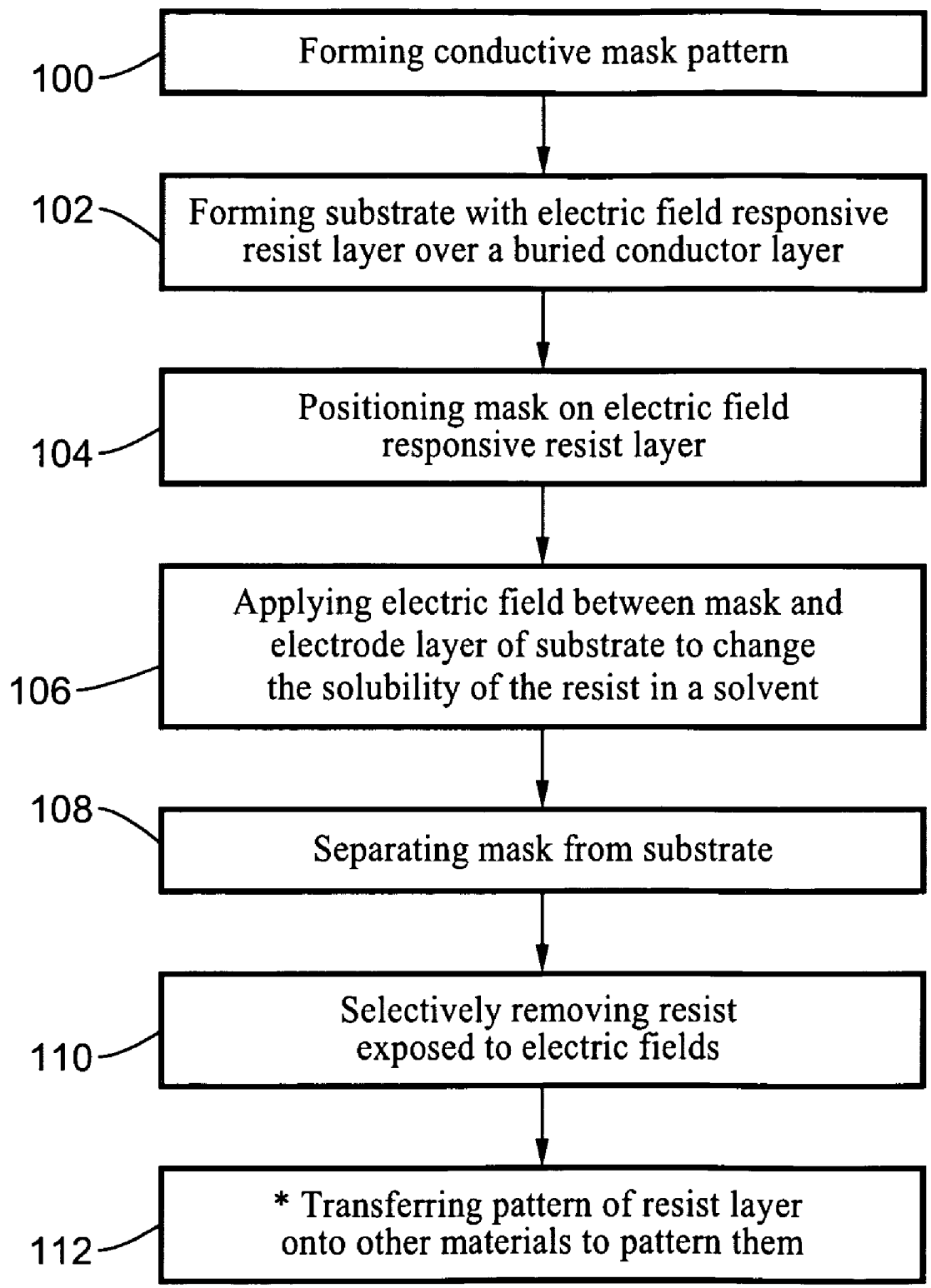
FIG. 8 is a flowchart of a method for performing nanoscale electric lithography according to an embodiment of the present invention which describes transfer of the final substrate pattern to another material.

The flowcharts of FIGS. 6-8 summarize embodiments of the NEL method. It should be appreciated that variations of, and additions to, these processes can be followed by one of ordinary skill in the art without departing from the teachings of the present invention.

FIG. 6 illustrates an example embodiment of the general method of the invention, wherein a conductive mask pattern 70 and substrate with an electrically alterable layer 72, such as a resist material, are formed in no particular order. The electrically alterable layer is then patterned 74 to alter its characteristics (e.g., removal) in response to electric field application between the mask and buried conductive layer in the substrate. A preferred embodiment of the technique utilizes a resist layer as the electrically alterable layer 72, wherein the solubility characteristic of the resist layer is altered in response to application of the electric field, therein supporting selective removal of the resist and underlying material. Selective processing is then performed at block 74 on substrate in response to the pattern created by the application of the electric field, such as a solvent-based process for removing the mask material exposed to the electric field.

FIG. 7 illustrates another example embodiment of the method in which a conductive mask pattern 80 and substrate with resist layer 82 are formed. The resist layer is then patterned by positioning 84 the mask on the resist layer. An electric field is applied 86 between the mask and buried conductive layer of substrate to alter resist properties (i.e., change solubility to removal). The mask is then separated 88 from the substrate, and the resist is selectively removed 90 which has been exposed to the electric fields.

FIG. 8 illustrates another example embodiment of the method in which both a conductive mask pattern and substrate are formed 100, 102 in any desired order. The substrate is formed with a electric field responsive resist layer over a buried conductive layer. The mask is then positioned 104 on the molecular resist layer and an electric field is applied 106 between the mask and the buried conductive layer of the substrate to cleave molecular bonds, or to otherwise increase the solubility of the resist material in a solvent. The mask is then separated 108 from the substrate and portions of the resist are selectively removed 110 which have been exposed to the electric fields. Finally, the pattern of molecular layer is optionally transferred 112 to another material to pattern it.

The electric field responsive resist layer may comprise a self-assembled molecular layer, polymer, monomer, oligomer, inorganic materials and the like whose solubility is altered when subjected to an electric field.

To facilitate NEL fabrication, an NEL fabrication machine is described which utilizes the described NEL alignment capabilities, as well as being preferably capable of applying electric fields between any desired number of electrode portions of the mask and substrate. An embodiment of the machine is configured for control of the parallelism and the gap width between the mask and substrate surfaces, as required by the NEL processes. The machine preferably provides a mechanical control system with six degrees-of-freedom, such as by modifying imprinting machines being developed by the inventor for lithographic imprinting.

In one embodiment of the machine gas gap sensors are integrated with through-the-lens (TTL) alignment sensors to control the mask approach to the substrate surface. After the gap has been reduced below ~10 □m, capacitance sensors, which are formed between the metal pads between the mask and the substrate, are activated. The relative position between the mask and the substrate can then be resolved with high resolution using capacitance sensing as the mask approaches the substrate. The dynamic control is beneficial for driving dynamic errors close to the resolution level of the sensor, an approach which can reach a fraction of the minimum pattern sizes on the mask and on the substrate. Bringing the dynamic precision close to the static precision enables the on-the-fly alignment by embedding it as part of a synchronized multi-axis coordinated motion, thus substantially streamlining and speeding up the process.

After the alignment has been achieved, the mask and the substrate can be held together in a vacuum pocket in order to pump out the residual air between the mask and the substrate. Hydrostatic air pressure <10 psi is then applied on the soft wall of the pocket to guarantee a homogeneous pressure over large areas. This pressure will be accurately controlled so as to guarantee the proximal contact between the mask and the substrate and also to avoid resist damage. Subsequently, a voltage will be applied between the conductive patterns on the mask and the substrate in order to "expose" the resist layer, preferably a molecular resist layer. The electrostatic attractive force between the mask and the substrate also assures electrical contact between the conductive patterns and molecules. Scale-up issues are addressed in the design of the machine to accommodate multiple functionalities in various wafer sizes, such as in six to twelve inch wafers.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of lithographic fabrication, comprising:
   forming a conductive mask;
   forming a substrate having an electrically responsive resist layer over a buried conductor layer;
   positioning said conductive mask upon the electric resist layer of said substrate;

applying an electric field between said conductive mask and the conductor layer of said substrate to alter said electrically responsive resist;

separating said conductive mask from said substrate; and selectively removing said electrically responsive resist in response to the mask pattern which was selectively exposed by the electric fields.

2. A method as recited in claim 1, wherein said conductive mask comprises:
an electrode;
an insulator on the surface of said electrode; and
a plurality of conductive regions extending from, or joined to, said electrode.

3. A method as recited in claim 1, wherein said electrically responsive resist layer is configured for being structurally altered in response to said electric field to either increase or decrease solubility during a process for selectively removing said resist.

4. A method as recited in claim 1, wherein said electrically responsive resist layer is a material in which changes to molecular links, bonds, or phases is created in portions exposed to said electric field thereby increasing the solubility of the material during solvent-based removal process.

5. A method as recited in claim 1, further comprising processing said substrate to transfer the patterns of the resist layer onto other materials.

6. A method as recited in claim 1, further comprising dividing said conductive mask, or said buried conductor layer of said substrate, or a combination of both into separately addressable conductive areas wherein a pattern is formed in response to the pattern of electric field application between the separately addressable conductive areas.

7. A method as recited in claim 1, further comprising:
dividing said conductive mask into a first set of separately addressable parallel conductive strips, and dividing said buried conductor layer into a second set of separately addressable parallel conductive strips which are oriented perpendicular to said first set;
wherein said electric field is applied between selected conductive strips in the first and second sets of separately addressable conductive elements to select the patterning of said resist layer.

8. A method as recited in claim 1, further comprising sensing the registration of said conductive mask with said substrate in response to sensing the capacitance between the conductive mask and the buried conductor layer in the substrate.

9. A method as recited in claim 1:
wherein changes to molecular links, bonds, phases, or any combination of links, bonds and phases arise within said electrically responsive resist layer in response to exposure to said electric field; and wherein said electrically responsive resist layer comprises a self-assembled molecule, or a polymer, or a monomer, or an oligomer or an inorganic material.

10. A method as recited in claim 9:
wherein said electrically responsive resist layer is self-assembled onto a conductive layer of the substrate; and
wherein the combination of said electrically responsive self-assembled resist layer and said buried conductive layer comprises thiol/Au, or silane/SiO2 or carbonyl/Ti, or amine/Pt.

11. A method as recited in claim 1, wherein said conductive mask is fabricated according to the method comprising:
creating a conductive pattern on a conductive substrate; and
forming an insulating layer over said conductive substrate, or a combination of said conductive substrate and conductive pattern.

12. A method as recited in claim 11, wherein the lithographic fabrication method can be utilized with a mask pattern feature size which is less than or equal to approximately ten nanometers (10 nm).

13. A method as recited in claim 11, further comprising polishing the insulating layer to expose the conductive pattern and flatten the surface of the substrate.

14. A method as recited in claim 1, wherein said conductive mask is fabricated according to the method comprising:
creating a conductive pattern on a substrate having a conductive layer;
depositing a multi-layer lattice having at least two different metals on said conductive pattern;
removing a surface portion of said multi-layer lattice; and
processing the surface of said multi-layer lattice in a selective process in which the different metals are differentially altered.

15. A method as recited in claim 14, wherein said surface portion of said multi-layer lattice is removed in a polishing step.

16. A method as recited in claim 14, wherein said processing of said multi-layer lattice comprises an oxidation process which is selective as to which metal is oxidized.

17. A method as recited in claim 14, wherein said multi-layer lattice fabrication process can generate resolutions below one nanometer (1 nm).

18. A method of lithographic fabrication, comprising:
forming a conductive mask;
forming a substrate having an electric field responsive resist layer over a buried conductor layer;
positioning said conductive mask upon the electric field responsive resist layer of said substrate;
applying an electric field between said conductive mask and the buried conductor layer of said substrate to change the solubility of the resist in a solvent;
separating said conductive mask from said substrate;
selectively removing said electric field responsive resist with a solvent in response to the mask pattern which was selectively exposed by the electric fields; and
transferring the pattern of said the electric field responsive resist layer onto other materials to pattern them.

19. A method as recited in claim 18, further comprising:
dividing said conductive mask, or said buried conductor layer of said substrate, or a combination of both into separately addressable conductive areas;
wherein the pattern is fabricated in response to the extent of electric field exposure applied between the separately addressable conductive areas.

* * * * *